United States Patent
Wong et al.

(10) Patent No.: US 7,724,163 B2
(45) Date of Patent: May 25, 2010

(54) APPARATUS OF MULTI-STAGE NETWORK FOR ITERATIVE DECODING AND METHOD THEREOF

(75) Inventors: Cheng-Chi Wong, Hsinchu (TW); Yung-Yu Lee, Hsinchu (TW); Ming-Wei Lai, Hsinchu (TW); Chien-Ching Lin, Hsinchu (TW); Hsie-Chia Chang, Hsinchu (TW); Chen-Yi Lee, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 12/178,987

(22) Filed: Jul. 24, 2008

(65) Prior Publication Data
US 2009/0160686 A1 Jun. 25, 2009

(30) Foreign Application Priority Data
Dec. 21, 2007 (TW) .............................. 96149409 A

(51) Int. Cl.
H03M 7/00 (2006.01)
(52) U.S. Cl. .......................................... 341/81; 341/50
(58) Field of Classification Search ................. 341/107, 341/59, 51, 50, 81, 58; 714/755, 786; 360/46
See application file for complete search history.

(56) References Cited

U.S. PATENT DOCUMENTS

| | | | | |
|---|---|---|---|---|
| 5,524,027 A | * | 6/1996 | Huisken | ....................... 375/341 |
| 6,947,500 B1 | * | 9/2005 | Carrozza et al. | ............. 375/340 |
| 7,584,389 B2 | * | 9/2009 | Park et al. | .................... 714/704 |

* cited by examiner

Primary Examiner—Brian Young
(74) Attorney, Agent, or Firm—Muncy, Geissler, Olds & Lowe, PLLC

(57) ABSTRACT

An apparatus and method of multi-stage network for iterative network are disclosed. The apparatus has M stages, and each stage uses N multiplexers to transmit N codeword partitions simultaneously. Every starting terminal, either the output port of memories, soft-in soft-out decoders, or multiplexers, has two paths to couple with two different multiplexers at next stage. One path connects the source to the first data port of one multiplexer; the other connects the source to the second data port of another multiplexer. The two multiplexers will be controlled with the same 1-bit signal, so each source has only one valid path to next stage. The invention can guarantee that the transmission of N data blocks is free from contention.

13 Claims, 8 Drawing Sheets

US 7,724,163 B2

APPARATUS OF MULTI-STAGE NETWORK FOR ITERATIVE DECODING AND METHOD THEREOF

BACKGROUND OF THE INVENTION

1. Field of the Invention

The present invention generally relates to a multi-stage network, and more particularly relates to an apparatus of multi-stage network for iterative decoding and method thereof.

2. Description of the Prior Art

FIG. 1 is a conventional communication system. The data in data source 11 transmitted through channel 14, wherein the data are interfered to cause incorrect data. For receiver getting correct data, Forward Error Correction technique is used to process data. The turbo encoder 12 is an example of such technique. The encoded data are modulated in modulator 13, and then they are sent to receiver via channel 14. The receiver receives data and demodulates them on demodulator 15, and then a turbo decoder 16 decodes data to obtain correct data 17. Thus the communication system with turbo decoder can reduce the error probability of data due to channel 14.

The turbo decoder has good capabilities for error correction in above mentioned communication system. The memories, interleavers, and SISO decoders are the main components in a turbo decoder. The received data will be stored in memories initially, and they are sent to the component soft-in soft-out (SISO) decoders to get some estimated value of the received codeword. It is a tendency to achieve high throughput by dividing a codeword into several partitions, letting these partitions be stored in multiple memories, and decoding these partitions simultaneously on multiple soft-in soft-out (SISO) decoders. However, conventional interleavers can not support this parallel architecture because they lead to some collisions while accessing the received data from memories, passing the data to parallel SISO decoders, and writing the decoding results back to memories.

Some contention-free interleavers are proposed to solve the collision problem. It is trivial to use an appropriate network 22 as the data bus to connect the multiple soft-in soft-out (SISO) decoders 21 and multiple memories 23 for each contention-free interleaver. The interconnection depends on the characteristics of different contention-free interleavers. As the number of the parallel components increases, the complexity of the network also increases. Although a fully-connected network can support all possible interconnections for various interleavers, it has some difficulties in implementation, such as hardware loading, control signal generation, and routing complexity. A low-complexity network which supports the required interconnection patterns is preferred.

The present invention provides a simple apparatus of network for iterative decoding, especially for the application of high parallel architectures. Moreover, two embodiments for the parallel architectures are given.

SUMMARY OF THE INVENTION

One object of the present invention is to provide an apparatus of multi-stage network for iterative decoding, and the apparatus is in charge of the transmission of concurrent codeword partitions from memories to soft-in soft-out (SISO) decoders, or vice versa. Its circuit utilizes simple multiplexers at each stage. Besides, a method which constructs the interconnection between every two adjacent stages is provided. After applying the method, the network can guarantee the contention-free property for the data transmission between multiple memories and multiple soft-in soft-out decoders. Two or more multiplexers in the same stage will share the same control signals, thus it alleviates the circuit overhead for assigning network controls. For the sake of simplicity, the typical 2-to-1 multiplexers are usually selected in the apparatus.

One object of the present invention is to provide an apparatus of multi-stage network for the parallel architectures using Inter-Block Permutation (IBP) Interleavers. An approach which uses some factor derived from the Inter-Block Permutation (IBP) definition is also provided to save the circuit overhead. The multiplexer-based apparatus along with control signals allows all required interconnections between parallel soft-in soft-out (SISO) decoders and parallel memories.

One object of the present invention is to provide an apparatus of multi-stage network for the parallel architectures using Quadratic Permutation Polynomial (QPP) Interleavers. An approach which uses some factor derived from the original formula of quadratic permutation polynomial is also provided to reduce the circuit overhead. The multiplexer-based apparatus along with control signals allows all required interconnections between parallel soft-in soft-out (SISO) decoders and parallel memories.

Other advantages of the present invention will become apparent from the following description taken in conjunction with the accompanying drawings wherein are set forth, by way of illustration and example, certain embodiments of the present invention.

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1:
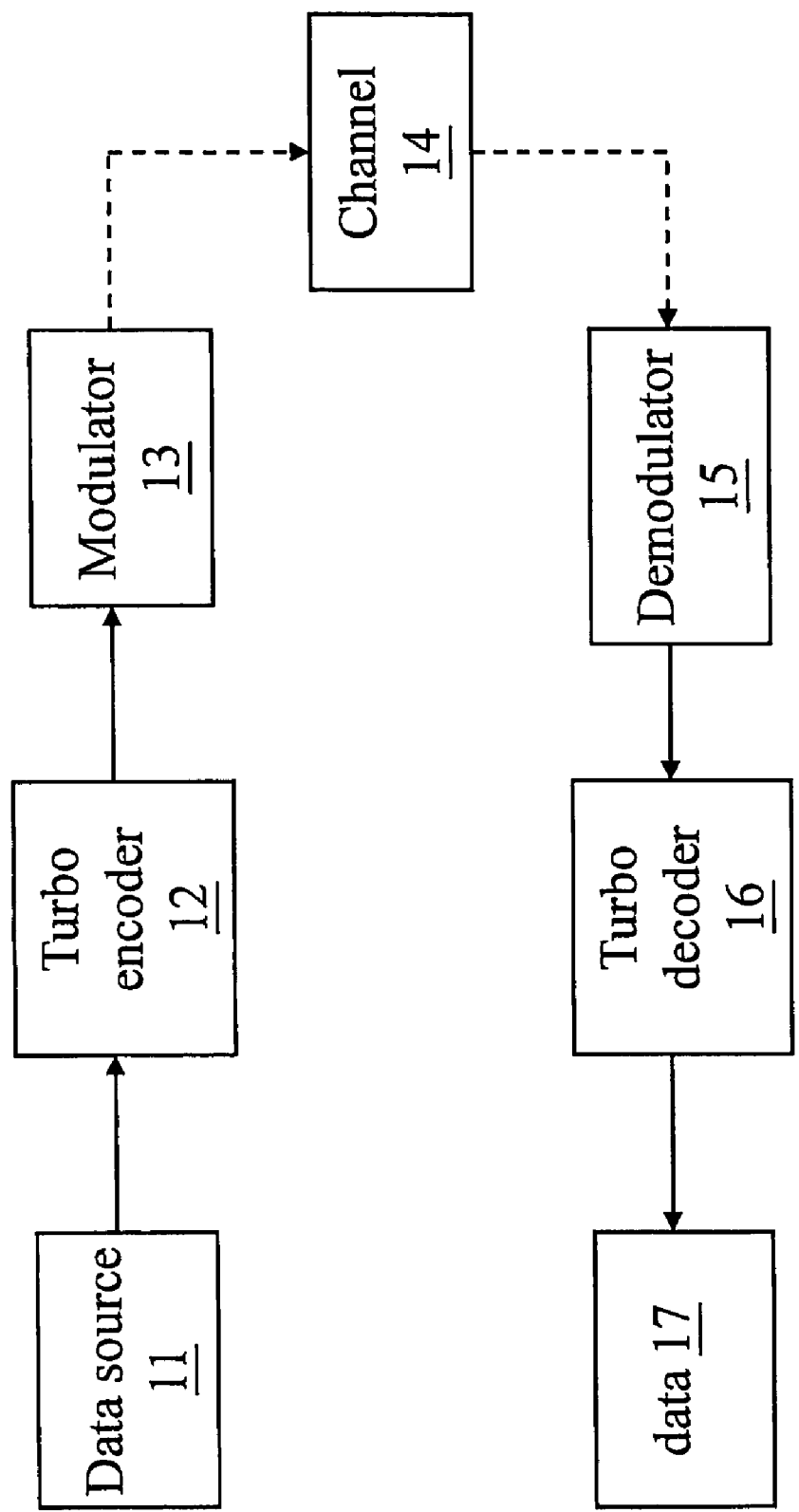
FIG. 1 is a conventional communication system.
Figure 2:
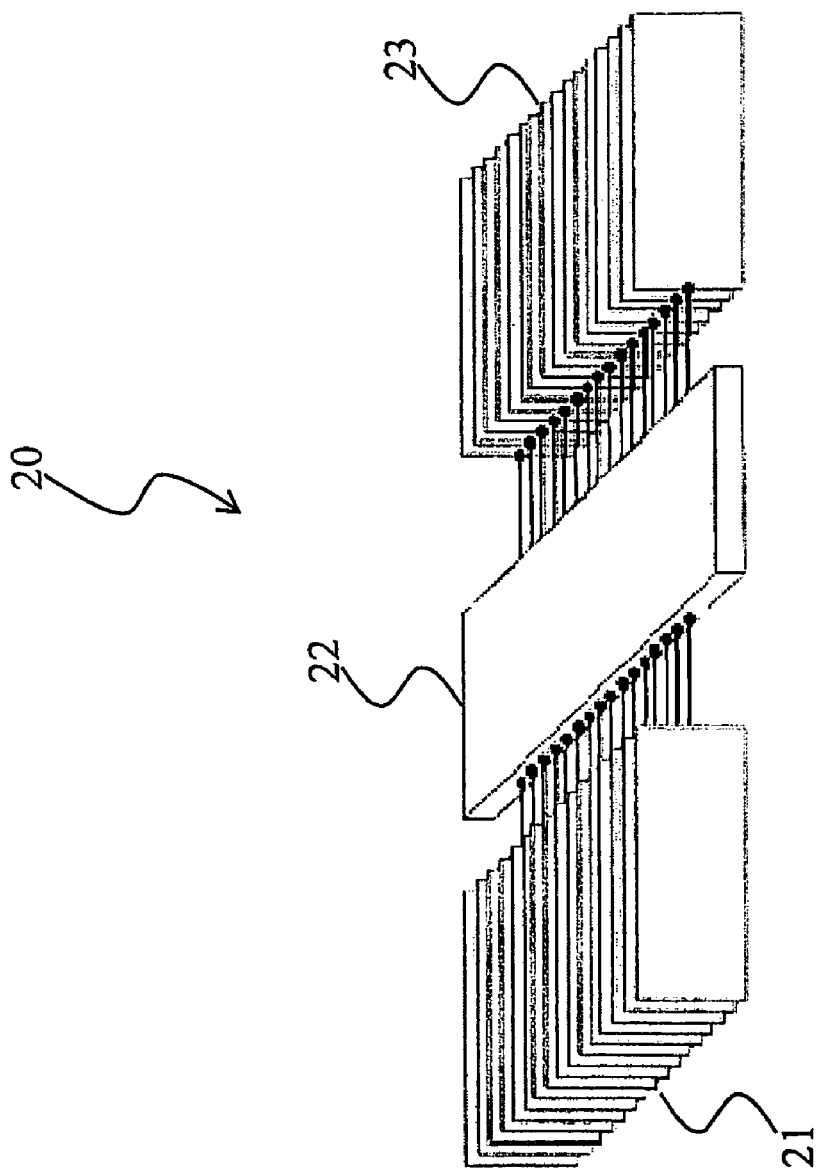
FIG. 2 is a structure of network connecting parallel memories and parallel soft-in soft-out decoders for iterative decoding according to one embodiment of the present invention.

The present invention discloses an apparatus of multi-stage network for iterative decoding. The FIG. 2 is a structure of network connecting parallel memories and parallel soft-in soft-out decoders for iterative decoding according to one embodiment of the present invention. The parallel architecture 20 includes a set of memory modules 21, an interconnection network 22 and several soft-in soft-out (SISO) decoders 23. Several codeword partitions are stored in multiple separate memory modules 21 and are transmitted to the soft-in soft-out (SISO) decoders 23 via the interconnection network 22. After the decoding process of each iteration, the decoding results from the soft-in soft-out (SISO) decoders 23 are written back to the memory modules 21 via the interconnection network 22.

Figure 3:
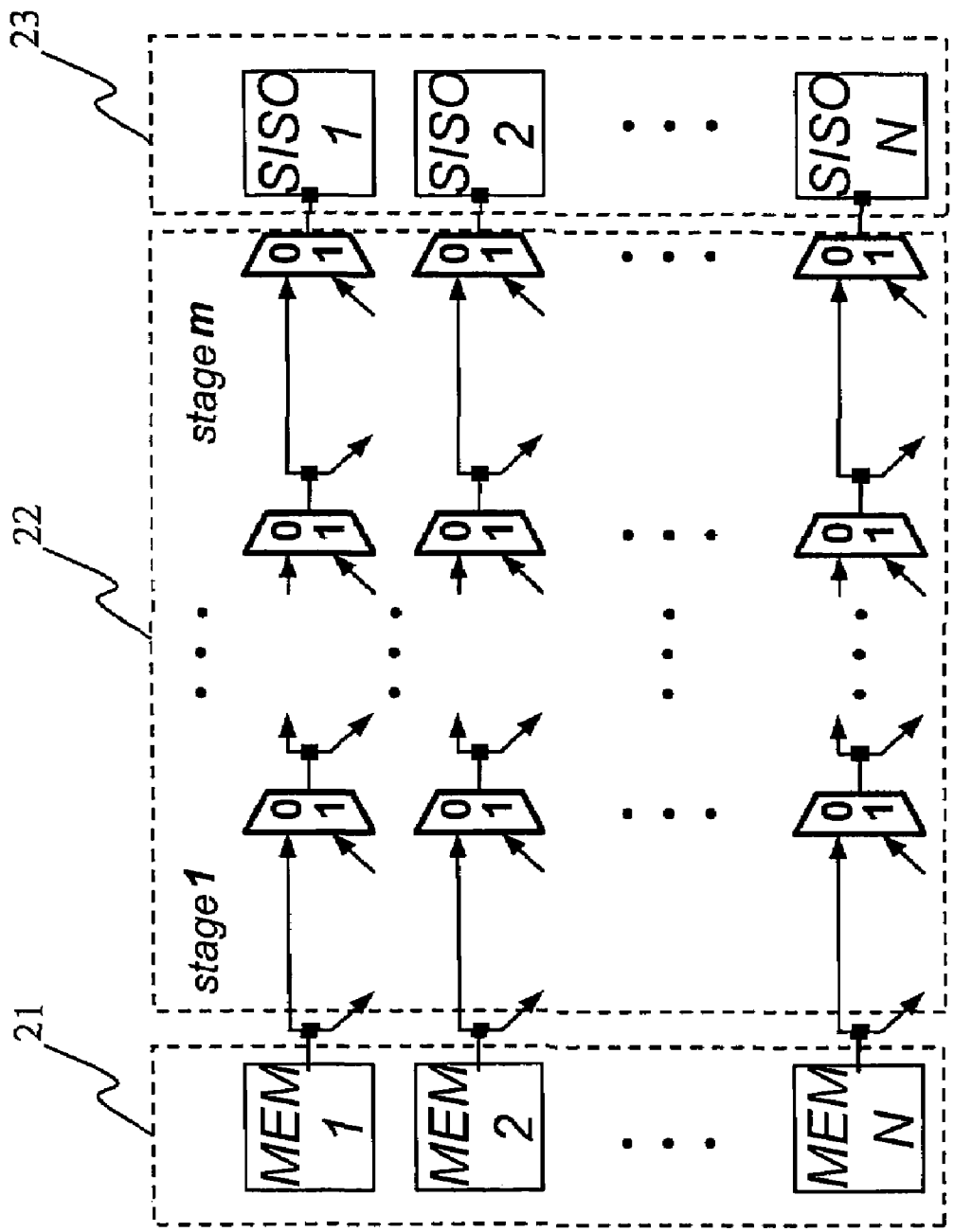
FIG. 3 is a structure diagram of the multi-stage network according to one embodiment of present invention.

Referring FIG. 3 is a structure diagram of the multi-stage network according to one embodiment of present invention. In a multi-stage network, the interconnection network 22 between N SISO decoders and N memories is composed of M stages, where every stage has N parallel 2-to-1 multiplexers. Such multiplexer comprises 0-input data port, 1-input data port, control port and output port. The data at output port are selected from either the data at 0-input data port or the data at 1-input data port, depending on the signal at control port. In the present network, the output port of every multiplexer and every memory has two outgoing paths; one is connected to the 0-input data port of one multiplexer in next stage, and the other is connected to the 1-input data port of another multiplexer in next stage. In addition, the two multiplexers with common input source must share the same control signal. When the control signal is set to 0, the data from memories or multiplexers at previous stage will be conveyed to its subsequent multiplexers; otherwise the data will be conveyed to the other multiplexers with the same control signal. That is, every output port of the memories or multiplexers has only one valid path to their following stages. All data blocks can travel through the interconnection network 22 without contention.

Figure 4:
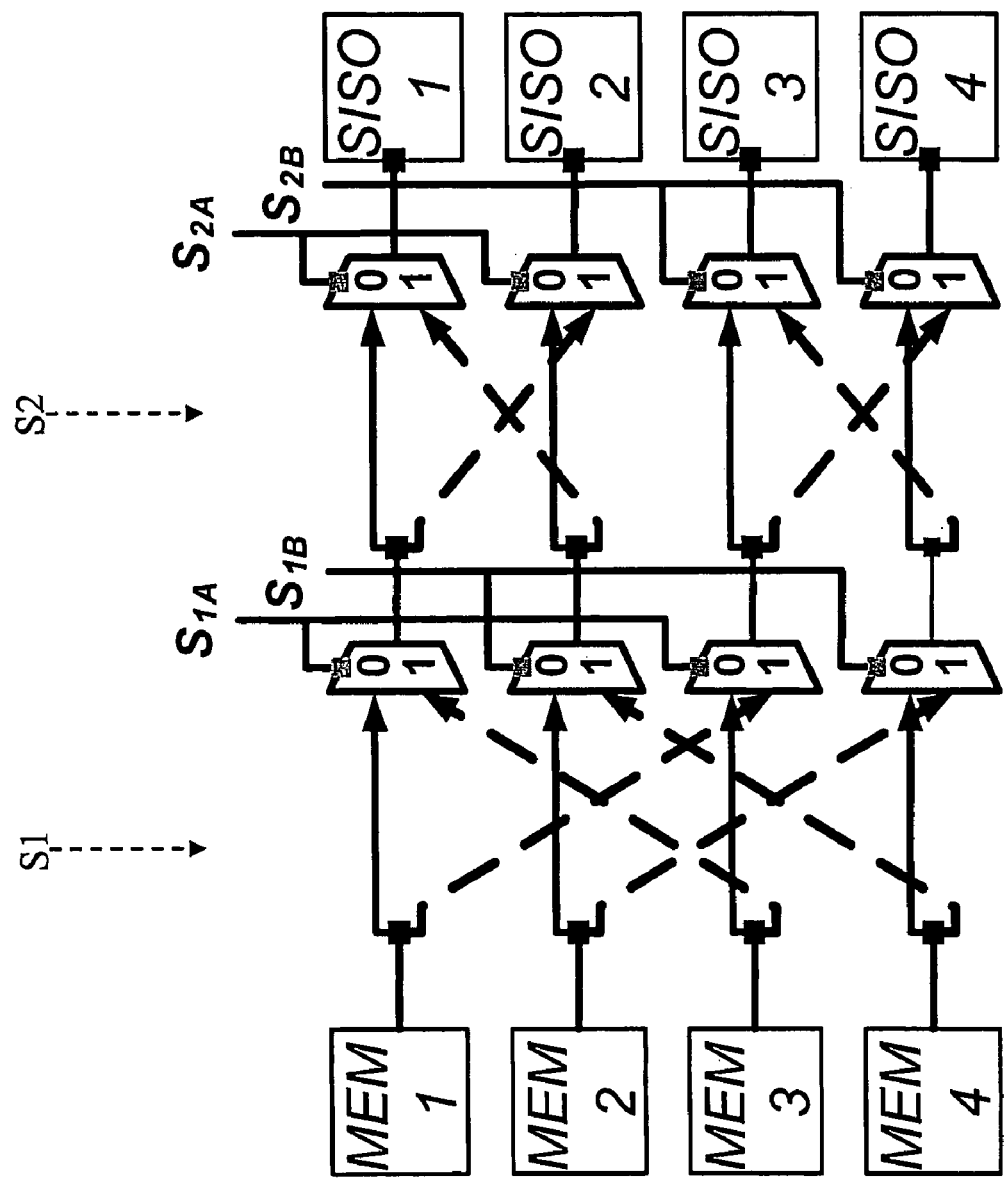
FIG. 4 is a structure diagram of 2-stage network and parallel decoders according to one embodiment of present invention.

The present invention determines control signals for the network based on both above-mentioned structure and the interleaving technique. Referring to FIG. 4 is a structure diagram of 4 SISO decoders, 4 memories, and a 2-stage network according to one embodiment of present invention. The butterfly network utilizes the interconnection of the N-point fast Fourier Transform (FFT); then modifies the original architecture with above-mentioned constraints for any two adjacent stages, and the assignments of control signals are also determined by the connections. The N memories or N multiplexers at each stage can be divided into (N/2) pairs. For each pair, both the output ports of the two source terminals are connected to the same two multiplexers at next stage, and the two multiplexers are controlled by the same signal. Therefore, the data of every pair will be transmitted directly or be exchanged with each other at each stage, depending on the corresponding control signal. The interconnection network 22 can be implemented as a butterfly network, which has two stage: S1 stage has first and third multiplexers controlled by $S_{1A}$ signal, and second and fourth multiplexers controlled by $S_{1B}$ signal; S2 stage has first and second multiplexers controlled by $S_{2A}$ signal, third and fourth multiplexers controlled by $S_{2B}$ signal. All the controls are 1-bit signals, and any combination of $S_{1A}$, $S_{1B}$, $S_{2A}$ and $S_{2B}$ will let four data blocks in memories MEM 1, MEM 2, MEM 3 and MEM 4 have their individual paths traveling to the soft-in soft-out (SISO) decoders SISO 1, SISO 2, SISO 3 and SISO 4.

Figure 5:
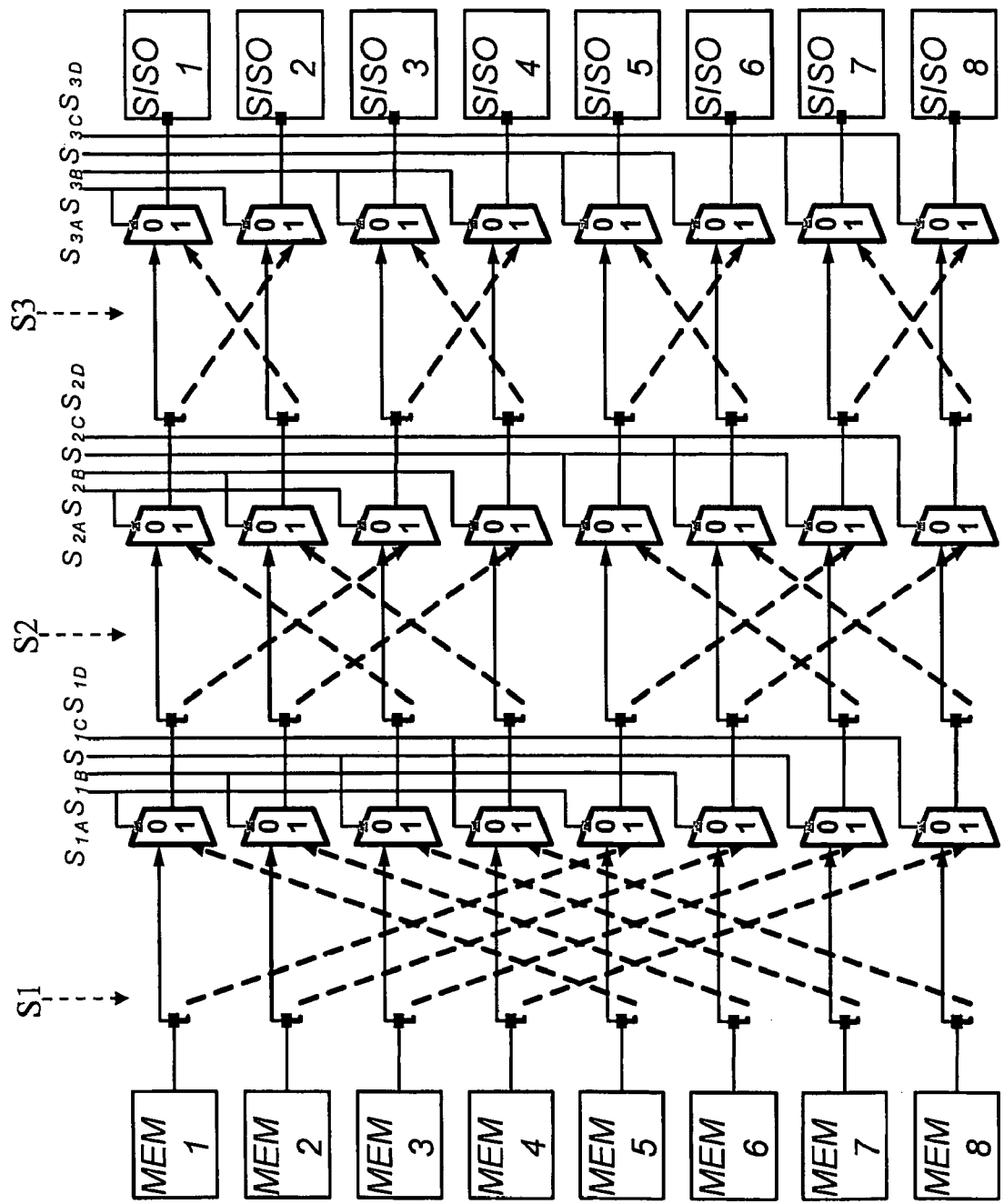
FIG. 5 is a structure diagram of 3-stage network and parallel decoders according to one embodiment of present invention.

Referring FIG. 5 is a structure diagram of 3-stage network and parallel decoders according to one embodiment of present invention, it is an interconnection network implemented in butterfly network. In S1 stage, the first and fifth multiplexers are controlled by $S_{1A}$ signal, the second and sixth multiplexers are controlled by $S_{1B}$ signal, the third and seventh multiplexers are controlled by $S_{1C}$ signal, and the fourth and eighth multiplexers are controlled by $S_{1D}$ signal. In S2 stage, the first and third multiplexers are controlled by $S_{2A}$ signal, the second and fourth multiplexers are controlled by $S_{2B}$ signal, the fifth and seventh multiplexers are controlled by $S_{2C}$ signal, and the sixth and eighth multiplexers are controlled by $S_{2D}$ signal. In S3 stage, the first and second multiplexers are controlled by $S_{3A}$ signal, the third and fourth multiplexers are controlled by $S_{3B}$ signal, the fifth and sixth multiplexers are controlled by $S_{3C}$ signal, and the seventh and eight multiplexers are controlled by $S_{3D}$ signal. Any set of signals can pass 8 data blocks stored in 8 memories MEM 1, MEM 2, MEM 3, MEM 4, MEM 5, MEM 6, MEM 7 and MEM 8 with no hazard condition. The 8 data blocks have their own paths through the interconnection network to 8 decoders SISO 1, SISO 2, SISO 3, SISO 4, SISO 5, SISO 6, SISO 7 and SISO 8. According to the embodiment, the architectures can be generalized to the architectures which consists of N soft-in soft-out decoders, N memories, and a M-stage network, where $N=2^M$ when using 2-to-1 multiplexers in the network.

Figure 6:
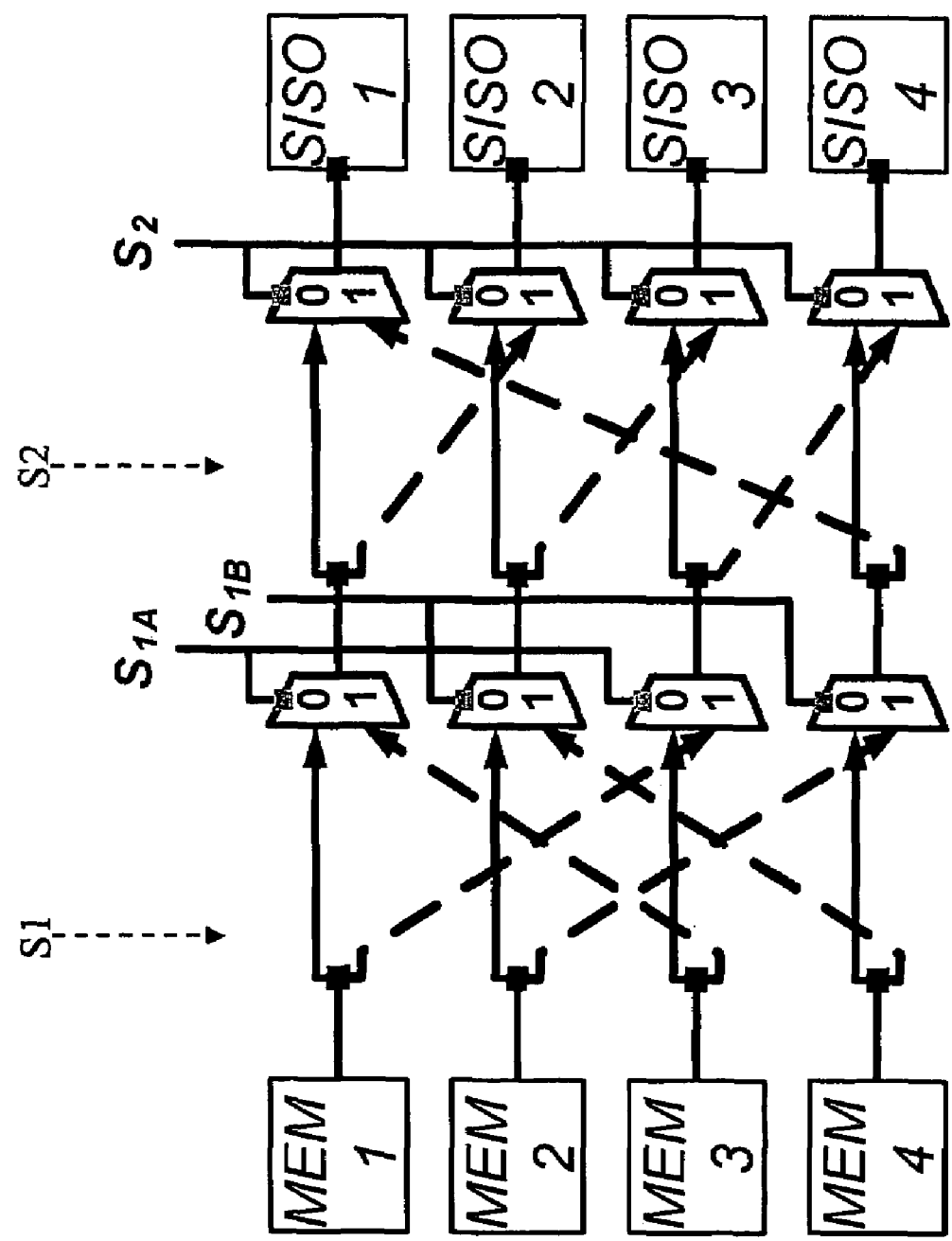
FIG. 6 is a structure diagram of 2-stage network and parallel decoders according to one embodiment of present invention.

Referring FIG. 6 is a structure diagram of 2-stage network and parallel decoders according to one embodiment of present invention, and the network is implemented in barrel shift network for realizing a Quadratic Permutation Polynomial interleaver. The name of this network is originated from the similar process of the barrel shifter which originally performs a cyclic rotation for a data word. This network utilizes the interconnection of barrel shifter for multiple data blocks transmitting concurrently. This barrel shift network has two stages: S1 stage has first and third multiplexers controlled by $S_{1A}$ signal, second and fourth multiplexers controlled by $S_{1B}$ signal; S2 stage has all multiplexers controlled by $S_2$ signal. The data at first stage and the data at second stage can be cyclically rotated by two positions and by one position respectively when their corresponding control signals are 1's. Any combination of $S_{1A}$, $S_{1B}$, and $S_2$ will let four data blocks in memories MEM 1, MEM 2, MEM 3 and MEM 4 have their individual paths to travel to the soft-in soft-out (SISO) decoders SISO 1, SISO 2, SISO 3 and SISO 4 without hazard. When those data blocks are permuted in the multi-stage network, the control signals are send to multiplexers to change the state of multi-stage network.

So, a given Quadratic Permutation Polynomial formula, $f(x)=f_1 x+f_2 x^2$, the variable x represents data's addresses, the changed address f(x) will be obtained. The coefficients $f_2$ and $f_1$ are determined by the length of dada blocks and set-up conditions to provide contention-free property.

Please referring to FIG. 6, a method to generate control signals can be implemented by low complexity hardware. In the embodiment, assuming that four data blocks M1, M2, M3, M4 in memories MEM 1, MEM 2, MEM 3, MEM 4 are passed through the network to soft-in soft-out (SISO) decoders SISO 4, SISO 3, SISO 2, SISO 1, wherein the path of data block M1 is from MEM 1 to SISO 4, the path of data block M2 is from MEM 2 to SISO 3, the path of data block M3 is from MEM 3 to SISO 2, the path of data block M4 is from MEM 4 to SISO 1. The control signals can be obtained from two factors.

(1) Data block M1 passes to the SISO 4, and the shift value is 3 by subtract the index of source from destination. Since a positive value ranged from 0 to (N−1) is preferred, the practical shift value will be derived from the subtraction result modulo 4. The modulo operation equals to taking the remainder while dividing the subtraction result by N.

(2) The adjacent data blocks M1 and M2 pass to the SISO 4 and SISO 3 respectively, the position of SISO 3 minus the position of SISO 4 is −1, and then −1 modulo 4 yields 3 for difference value between two destinations' indexes.

(3) In the S1 stage, the first control signal $S_{1A}$ is from the most significant bit of the shift value 3, whose binary expression is 11, and the value of $S_{1A}$ is 1; the second signal $S_{1B}$ needs to subtract 1 from the difference value first, add shift value 3 to previous result, and then modulo 4 yields 1, whose binary expression is 01, and the value of $S_{1B}$ is 0 from the most significant bit of 1.

(4) In the S2 stage, the signal $S_2$ is from the shift value 3 modulo 2 yields 1, whose binary expression is 1, and the signal $S_2$ is 1.

Figure 7:
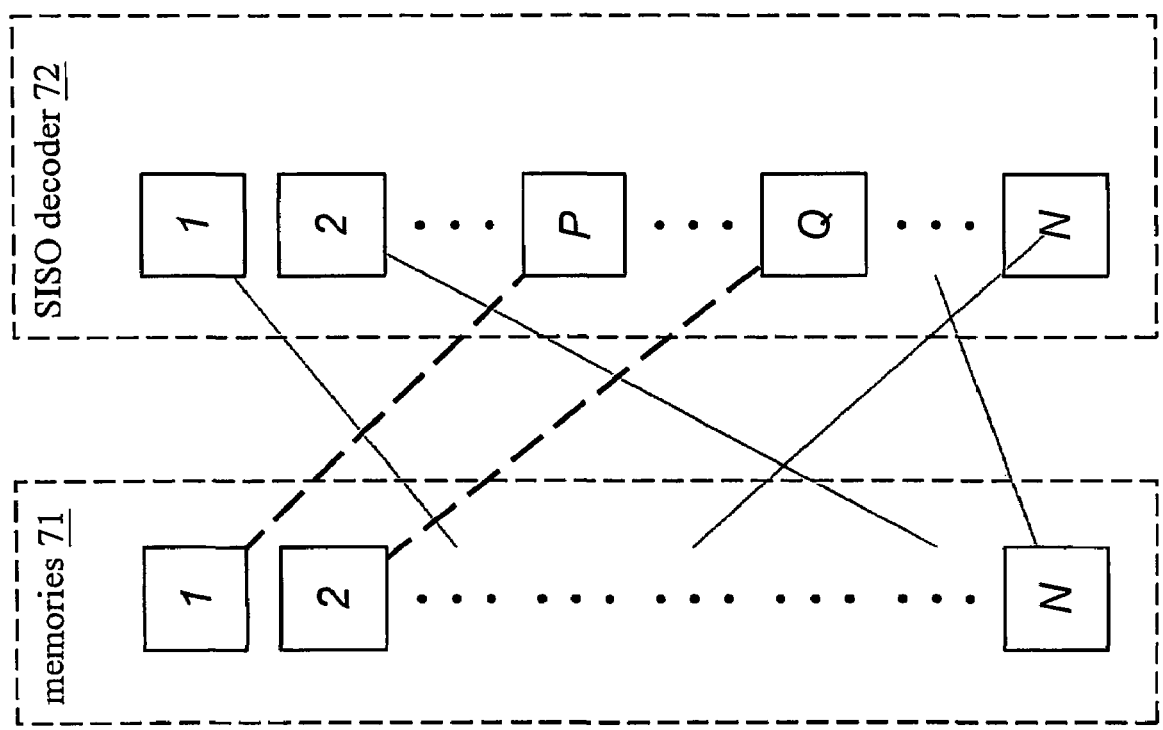
FIG. 7 is a data blocks transmission diagram according to one embodiment of present invention.

In one embodiment, there are N data blocks using the Quadratic Permutation Polynomial interleaver, the interconnection network has $\log_2 N$ stages. All data blocks are stored in memories from MEM 1, MEM 2, MEM 3 . . . to MEM N, the soft-in soft-out (SISO) decoders from SISO 1, SISO 2, SISO 3 . . . to SISO N are the endpoint. Following steps are common process applying to the Quadratic Permutation Polynomial interleaver. And please referring to the FIG. 7:

(1) Choose arbitrary two data blocks, and find their destination indexes of soft-in soft-out (SISO) decoder. Based on the indexes of the original two source and their corresponding destinations, the control signals for the whole network can be determined. With loss of generality, the first and second memories are chosen here for illustration. The data block in the first memory 71 is passed to the Pth SISO decoder 72, and the data block in the second memory 71 is passed to the Qth SISO decoder 72; the shift value of the data block in the first memory 71 is decided by (P−1) mod N, and the difference value between two destinations of the first data block and second data block is decided by (Q−P) mod N.

(2) In the M-stage apparatus connecting N source terminals and N destination terminals, the barrel shift network requires (N/2)-bit control signal for first stage, (N/4)-bit control signal for the second stage, . . . , $(N/2^M)$-bit control signal for the final stage.

(3) The control signals for the whole decoder can be determined along with the above-mentioned shift value and difference value. Using the two values to calculate all shift values of the data blocks in the N parallel memories. Finding the shift values of all data blocks from the two values is much easier than computing all shift values directly from the formula of Quadratic Polynomial Permutation (QPP) interleaver. The control signals can be further derived from the binary expression of N shift values. Since at least two multiplexers share the same control signals, only (N/2) shift values are required during the process.

Figure 8:
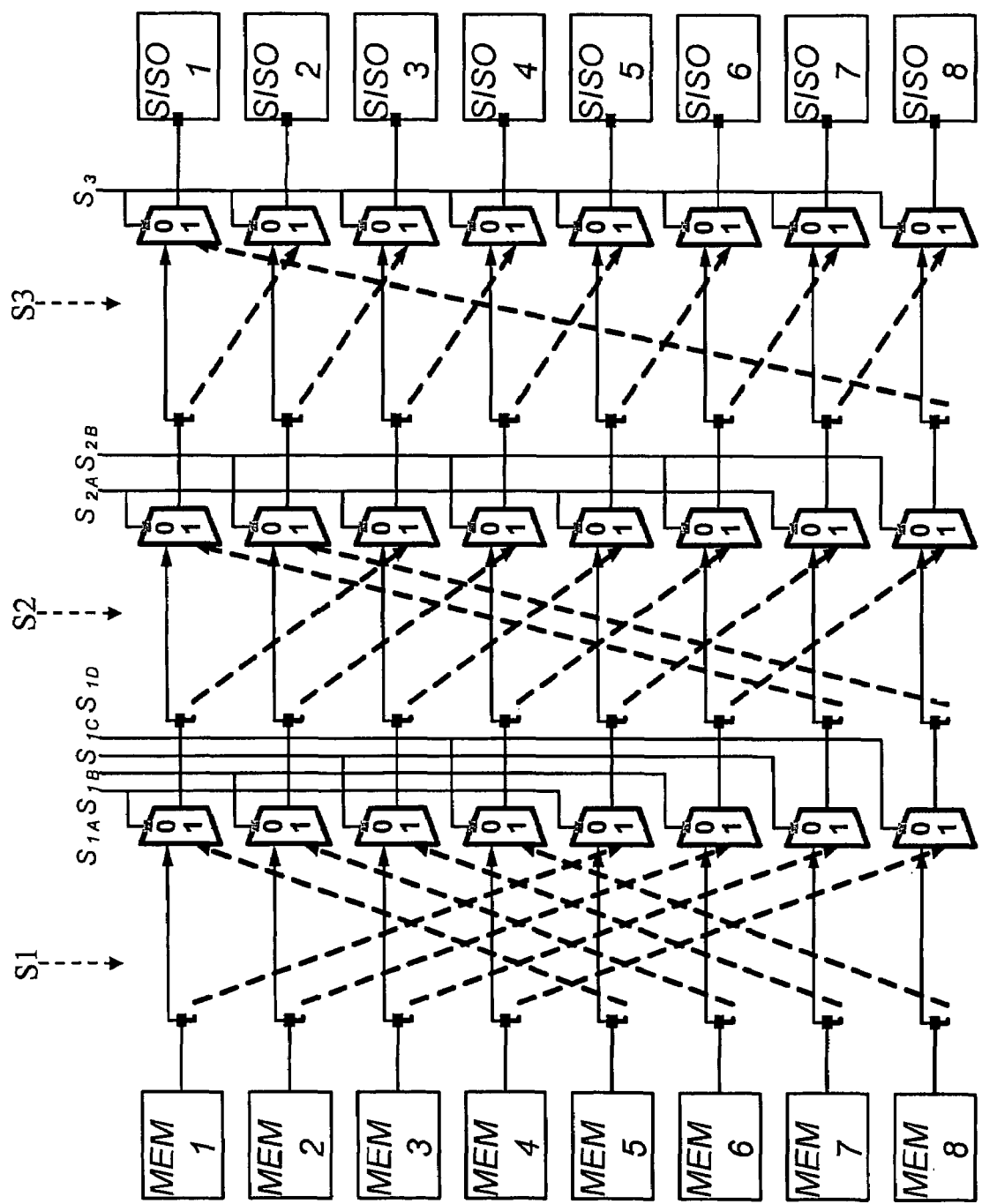
FIG. 8 is a structure diagram of 3-stage network and parallel decoders according to one embodiment of present invention.

Referring FIG. 8 is a structure diagram of 3-stage network and parallel soft-in soft-out decoders according to one embodiment of present invention, and the network is implemented with barrel shift network for realizing a Quadratic Permutation Polynomial interleaver. The barrel shift network has three stages: S1 stage has first and fifth multiplexers controlled by $S_{1A}$ signal, second and sixth multiplexers controlled by $S_{1B}$ signal, third and seventh multiplexers controlled by $S_{1C}$ signal, and fourth and eighth multiplexers controlled by $S_{1D}$ signal; S2 stage has first, third, fifth and seventh multiplexers controlled by $S_{2A}$ signal, and second, fourth sixth and eighth multiplexers controlled by $S_{1B}$ signal; and S3 stage has all multiplexers controlled by $S_3$ signal. The data at first stage, the data at second stage, and the data at third stage can be cyclically rotated by four positions, by two positions, and by one position respectively when their corresponding control signals are 1's. Any combination of these control signals guarantees that the eight data blocks in memories MEM 1, MEM 2, MEM 3 MEM 4, MEM 5, MEM 6 MEM 7 and MEM 8 have their individual paths to the soft-in soft-out (SISO) decoders SISO 1, SISO 2, SISO 3, SISO 4, SISO 5, SISO 6, SISO 7 and SISO 8 without hazard. When data blocks are permuted in the multi-stage network, the control signals are send to multiplexers to change the state of multi-stage network.

According to the above description, the decoder using contention-free interleaver and parallel structure can achieve both high speed transmission and excellent decoding performance. The present invention can be applied to iterative decoder, such as Turbo decoder or LPDC decoder, and reduce routing complexity of the network between the memories and SISO decoders.

Accordingly, the present invention discloses a structure of multi-stage network and method thereof, and passes data through the interconnection network. The interconnection network implemented with basic logic circuit, multiplexer, and regular network pattern can promises characteristic of the chosen interleaver. So the present invention utilizes low-complexity multi-stage network for the realization of parallel decoder structure with Contention-Free Interleaver.

For summarization, the present invention utilizes a multi-stage network to be an interconnection between several memories and soft-in soft-out (SISO) decoders. Every stage in the multi-stage network comprises multiplexers controlled by external signals. The connection in the multi-stage network ensures all data blocks have distinguish path to go through without hazard. The hardware structure is implemented by basic multiplexers. Moreover, most multiplexers have common control signals. Thus the present invention provides a low-complexity design methodology.

While the invention is susceptible to various modifications and alternative forms, a specific example thereof has been shown in the drawings and is herein described in detail. It should be understood, however, that the invention is not to be limited to the particular form disclosed, but to the contrary, the invention is to cover all modifications, equivalents, and alternatives falling within the spirit and scope of the appended claims.

What is claimed is:

1. An apparatus of multi-stage network for iterative decoding process comprising:

a network acting as an interconnection between multiple memories and multiple soft-in soft-out decoders and being responsible for the contention-free data transmission;

wherein the network which connects N source terminals and N destination terminals includes M stages for providing contention-free interconnection, here $N=2^M$;

wherein the every stage of the network is constructed with N 2-to-1 multiplexers, which each selects one output data between its first input data port or its second input data port, depending on a single-bit control signal.

2. The apparatus of multi-stage network for iterative decoding process according to claim 1, wherein the amount of the N 2-to-1 multiplexers in every stage is equal to either the amount of source terminals or the amount of N destination terminals.

3. The apparatus of multi-stage network for iterative decoding process according to claim 1, wherein the route from the N source terminals to first stage and the route from any stage to its following stage satisfy the constraint that every output port of the hardware in the N source terminals and every output port of the 2-to-1 multiplexers in each stage have two links to their following stage, where one link is connected to the first input data port of one 2-to-1 multiplexer, and the other link is connected to the second input data port of another 2-to-1 multiplexer in next stage, and those 2-to-1 multiplexers with common input source must share the same control signal.

4. The apparatus of multi-stage network for iterative decoding process according to claim 1, wherein the network is a butterfly network.

5. The apparatus of multi-stage network for iterative decoding process according to claim 4, wherein the butterfly network provides the required interconnections of the parallel decoder architectures along with inter-block permutation interleavers.

6. The apparatus of multi-stage network for iterative decoding process according to claim 1, wherein the network is a barrel shift network.

7. The apparatus of multi-stage network for iterative decoding process according to claim 6, wherein the barrel shift network provides the required interconnections for the parallel decoder architectures along with quadratic permutation polynomial interleavers.

8. The apparatus of multi-stage network for iterative decoding process according to claim 1, further including a control unit coupling to the network to control the route for the data transmission.

9. An method for iterative decoding in multi-stage network comprising:

choosing arbitrary two data blocks from N source terminals, and find their destinations' indexes, and using the indexes of the original two sources and their corresponding destinations to determine a plurality of control signals for a network;

obtaining a shift value X by subtracting the index of first selected source from the index of the corresponding destination;

obtaining a difference value Y from the index of destination of second selected source minus the index of destination of first selected source;

getting $(N/2^m)$ bits as the control signals for the m-th stage network, wherein each control signal is $[(Y-1) \times n + X] \mod(N/m)$, n is from 0 to $(N/2^m)-1$ and integer; and processing the N data blocks from first stage to the Mth stage according to the control signals.

10. The method for iterative decoding in multi-stage network according to claim 9, wherein the $X=(P-1)\mod N$, P is the index of the corresponding destination of the first data block.

11. The method for iterative decoding in multi-stage network according to claim 9, wherein the $Y=(Q-P)\mod N$, P is the index of the corresponding destination of the first data block, and Q is the index of the corresponding destination of the second data block.

12. The method for iterative decoding in multi-stage network according to claim 9, wherein the network is a butterfly network.

13. The method for iterative decoding in multi-stage network according to claim 9, wherein the network is a barrel shift network.

* * * * *